United States Patent
Tan et al.

(10) Patent No.: US 9,892,991 B2
(45) Date of Patent: Feb. 13, 2018

(54) CONNECTABLE PACKAGE EXTENDER FOR SEMICONDUCTOR DEVICE PACKAGE

(71) Applicant: Infineon Technologies AG, Neubiberg (DE)

(72) Inventors: Tian San Tan, Melaka (MY); Theng Chao Long, Melaka (MY); Ming Kai Benny Goh, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 357 days.

(21) Appl. No.: 14/290,046

(22) Filed: May 29, 2014

(65) Prior Publication Data

US 2015/0348864 A1 Dec. 3, 2015

(51) Int. Cl.
*H01L 23/367* (2006.01)
*H01L 23/46* (2006.01)
(Continued)

(52) U.S. Cl.
CPC ...... *H01L 23/3672* (2013.01); *H01L 21/4871* (2013.01); *H01L 21/4882* (2013.01); *H01L 21/52* (2013.01); *H01L 21/56* (2013.01); *H01L 23/3675* (2013.01); *H01L 23/46* (2013.01); *H01L 23/49524* (2013.01); *H01L 23/49562* (2013.01); *H01L 23/49568* (2013.01); *H01L 24/40* (2013.01); *H01L 29/7395* (2013.01); *H01L 29/7802* (2013.01);
(Continued)

(58) Field of Classification Search
CPC . H01L 21/4871; H01L 23/3672; H01L 21/56; H01L 23/3675; H01L 21/4882
See application file for complete search history.

(56) References Cited

U.S. PATENT DOCUMENTS 3,414,775 A * 12/1968 Melan ................ H01L 23/3675
257/722
6,081,027 A 6/2000 Akram
(Continued)

FOREIGN PATENT DOCUMENTS

| CN | 1641901 A | 7/2005 |
|---|---|---|
| CN | 202034361 U | 11/2011 |
| TW | 511450 B | 11/2002 |

*Primary Examiner* — Anthony Ho
*Assistant Examiner* — Antonio Crite
(74) *Attorney, Agent, or Firm* — Murphy, Bilak & Homiller, PLLC

(57) ABSTRACT

A semiconductor packaging system includes a semiconductor device package having a semiconductor chip with two or more terminals and a protective structure encapsulating and electrically insulating the semiconductor chip. Two or more electrical conductors that are each electrically connected to one of the terminals extend to an outer surface of the protective structure. A first surface feature is on an exterior surface of the semiconductor device package. The system further includes a connectable package extender having a second surface feature configured to interlock with the first surface feature when the first surface feature is mated with the second surface feature so as to secure the package extender to the semiconductor device package. An extension portion adjoins and extends away from the exterior surface of the semiconductor device package when the package extender is secured to the semiconductor device package.

14 Claims, 9 Drawing Sheets

(51) Int. Cl.
*H01L 21/48* (2006.01)
*H01L 21/52* (2006.01)
*H01L 21/56* (2006.01)
*H01L 29/739* (2006.01)
*H01L 29/78* (2006.01)
*H01L 23/495* (2006.01)
*H01L 23/00* (2006.01)
H01L 23/31 (2006.01)
H01L 23/473 (2006.01)

(52) U.S. Cl.
CPC ........ *H01L 23/3107* (2013.01); *H01L 23/473* (2013.01); *H01L 2224/32245* (2013.01); *H01L 2224/40245* (2013.01); *H01L 2924/13055* (2013.01); *H01L 2924/181* (2013.01)

(56) References Cited

U.S. PATENT DOCUMENTS

| | | | |
|---|---|---|---|
| 6,552,267 B2 | 4/2003 | Tsao et al. | |
| 6,747,360 B2 * | 6/2004 | Fukuizumi | H01L 23/49524 257/690 |
| 2002/0048158 A1 * | 4/2002 | Hashimoto | H01L 23/49838 361/803 |
| 2005/0224945 A1 * | 10/2005 | Saito | H01L 23/49575 257/686 |
| 2009/0127678 A1 * | 5/2009 | Fan | H01L 23/49541 257/666 |
| 2011/0163438 A1 * | 7/2011 | Takahashi | H01L 21/561 257/698 |
| 2011/0309893 A1 * | 12/2011 | Kawamura | H01L 23/48 333/104 |

\* cited by examiner

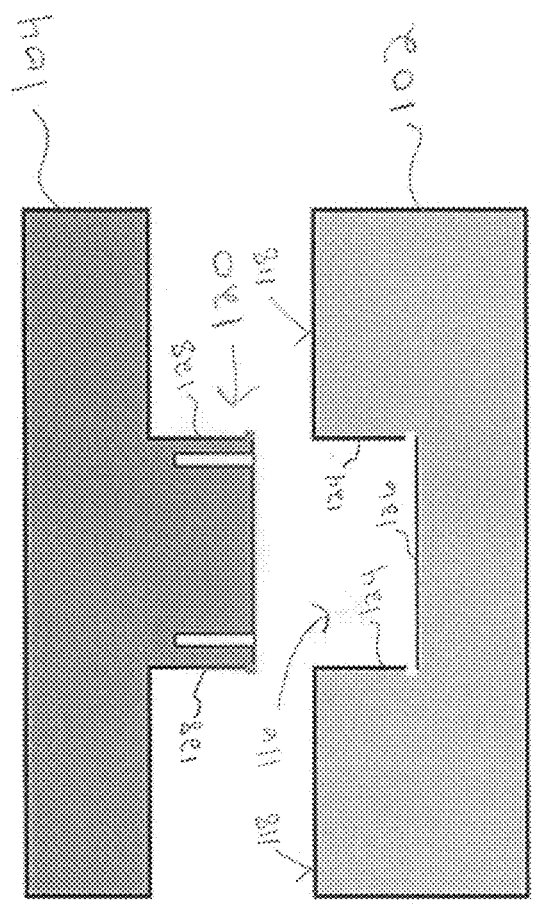

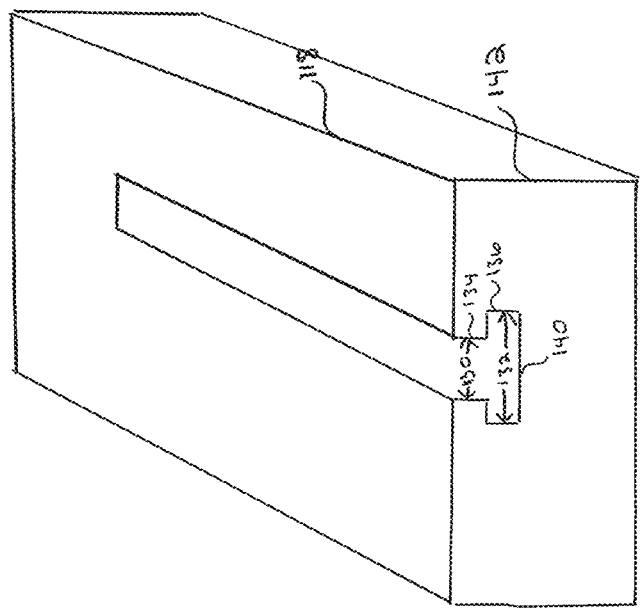
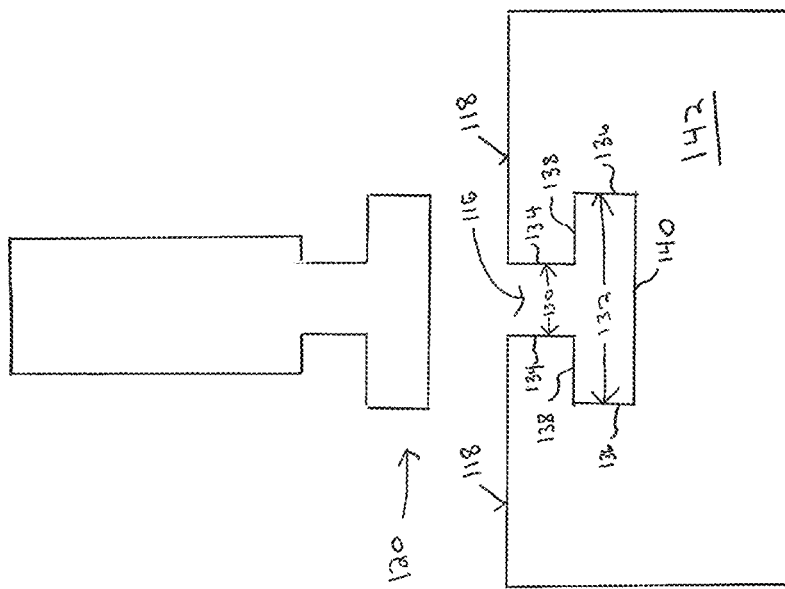
Fig. 3A
Fig. 3B
Fig. 3

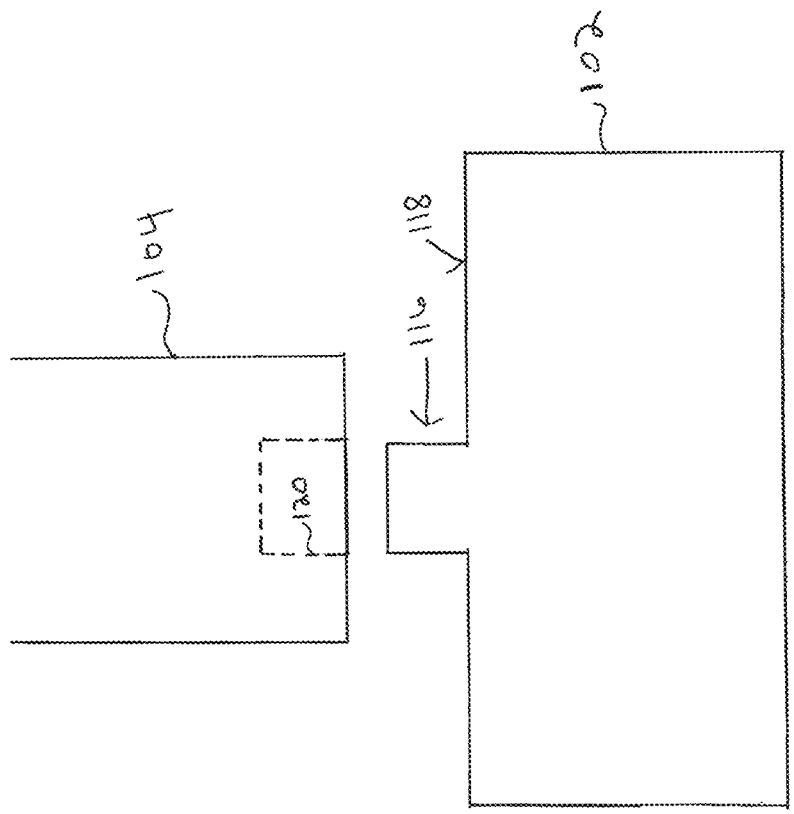
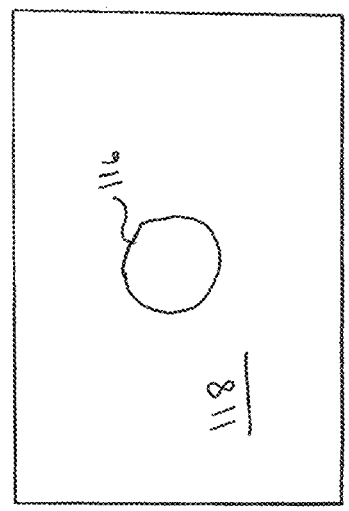
Fig. 4

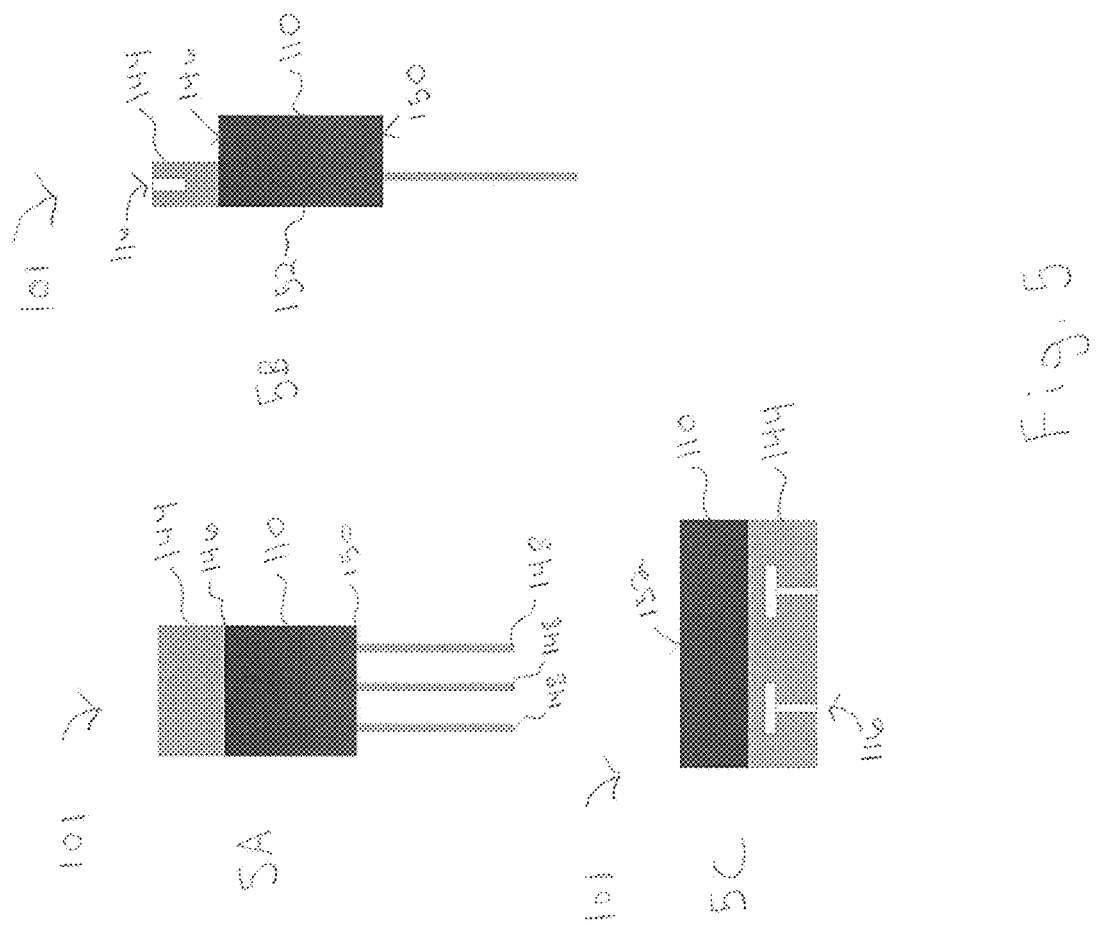

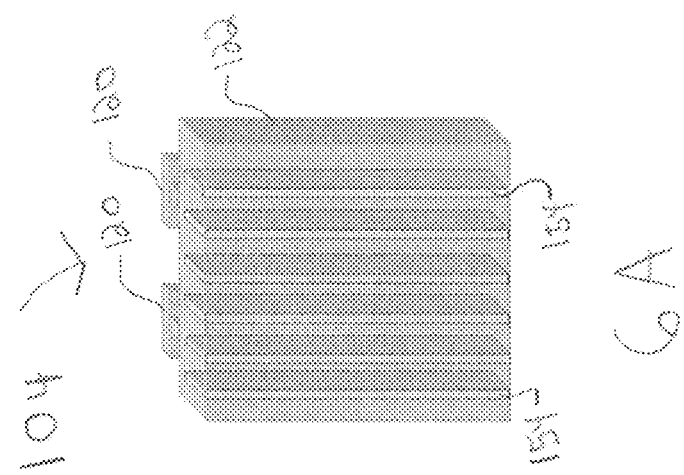
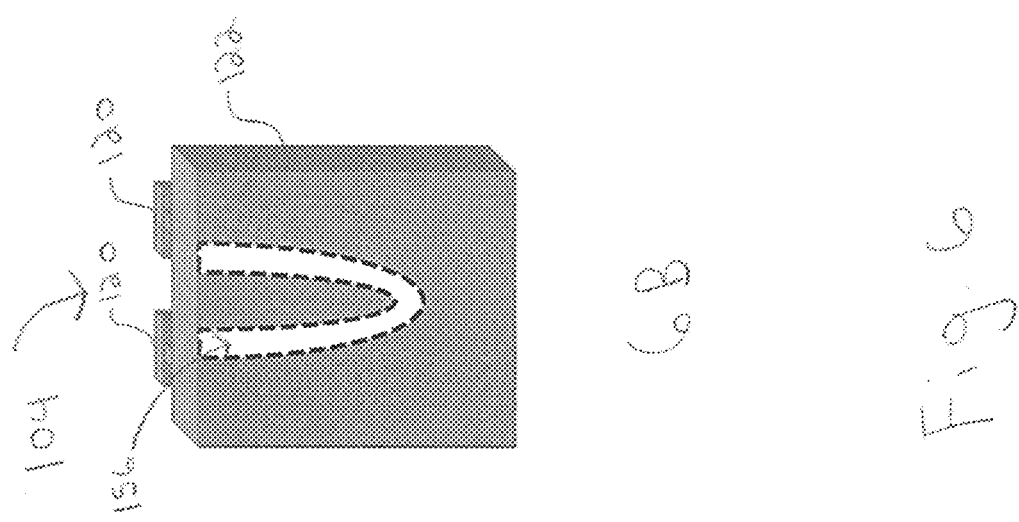
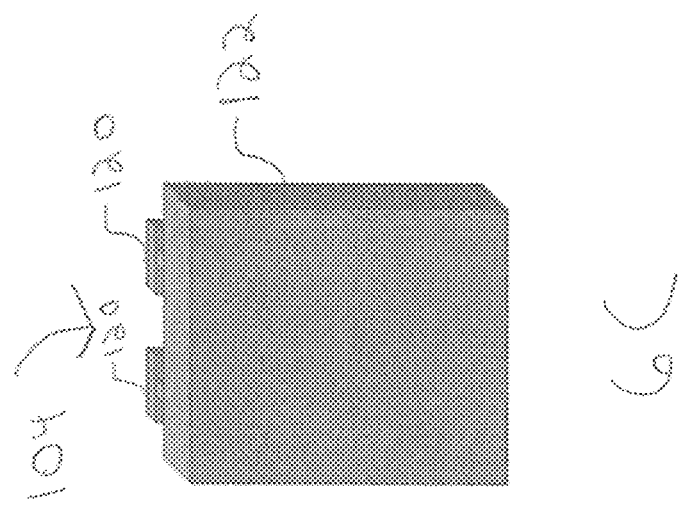
Fig. 9

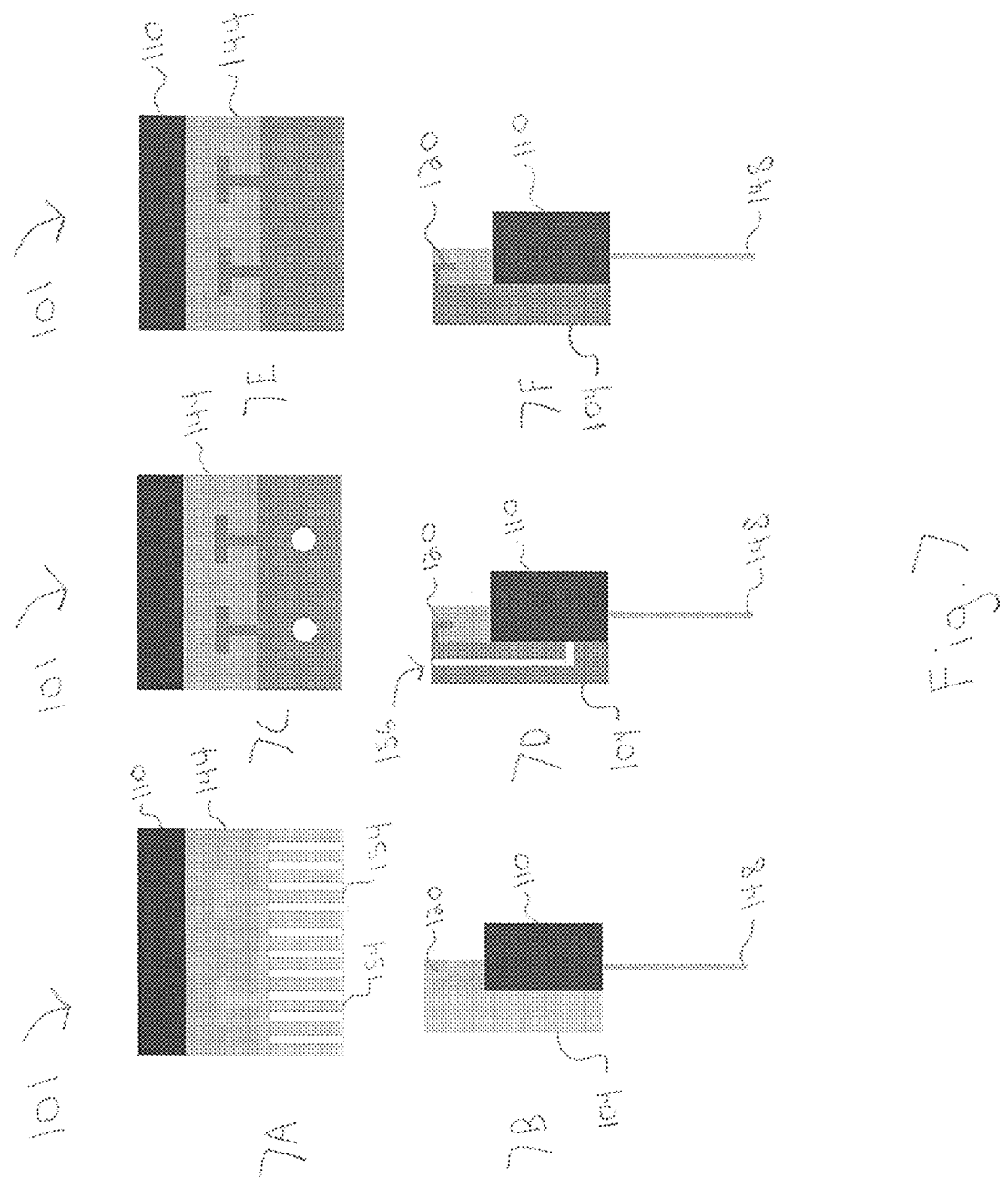

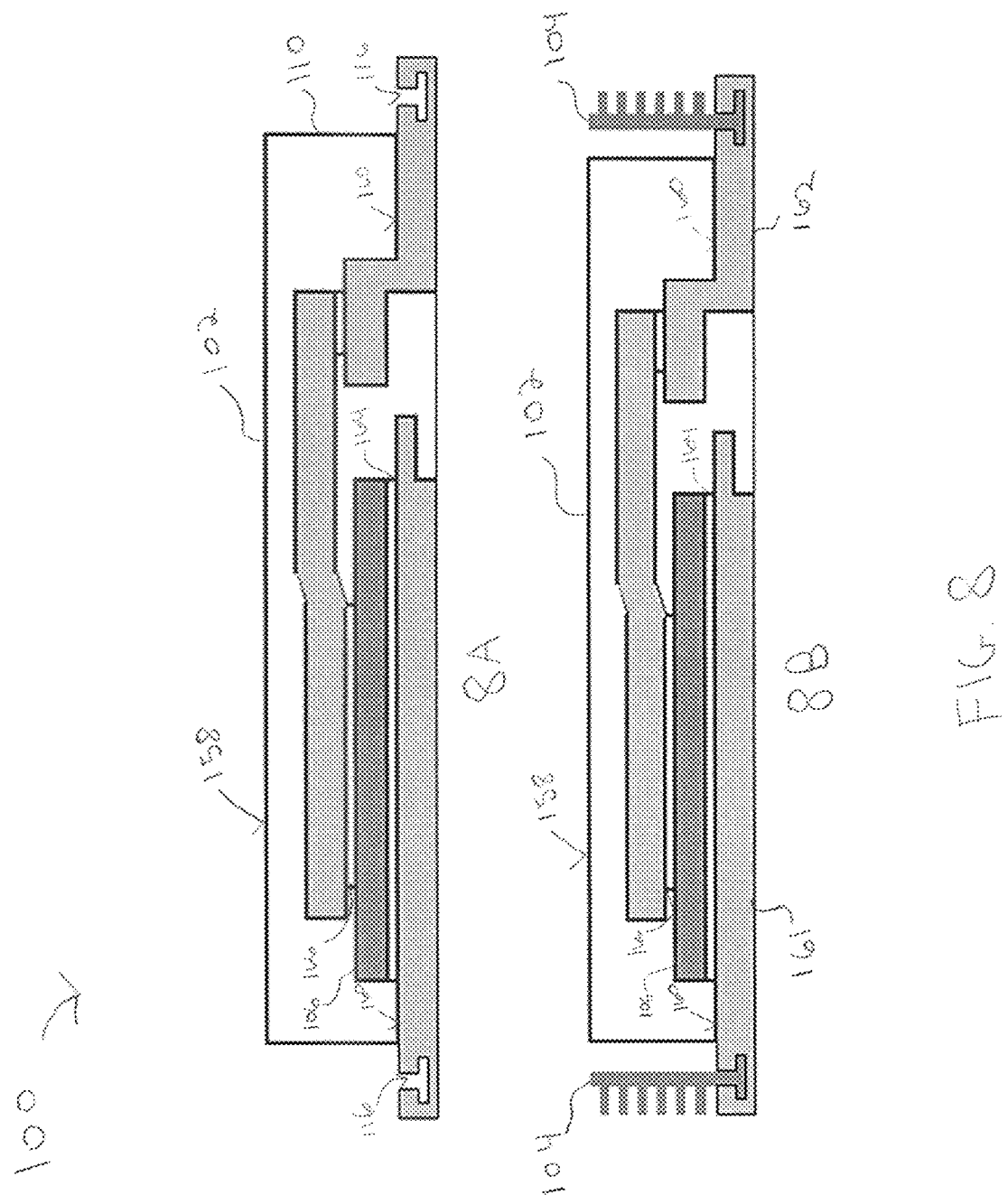

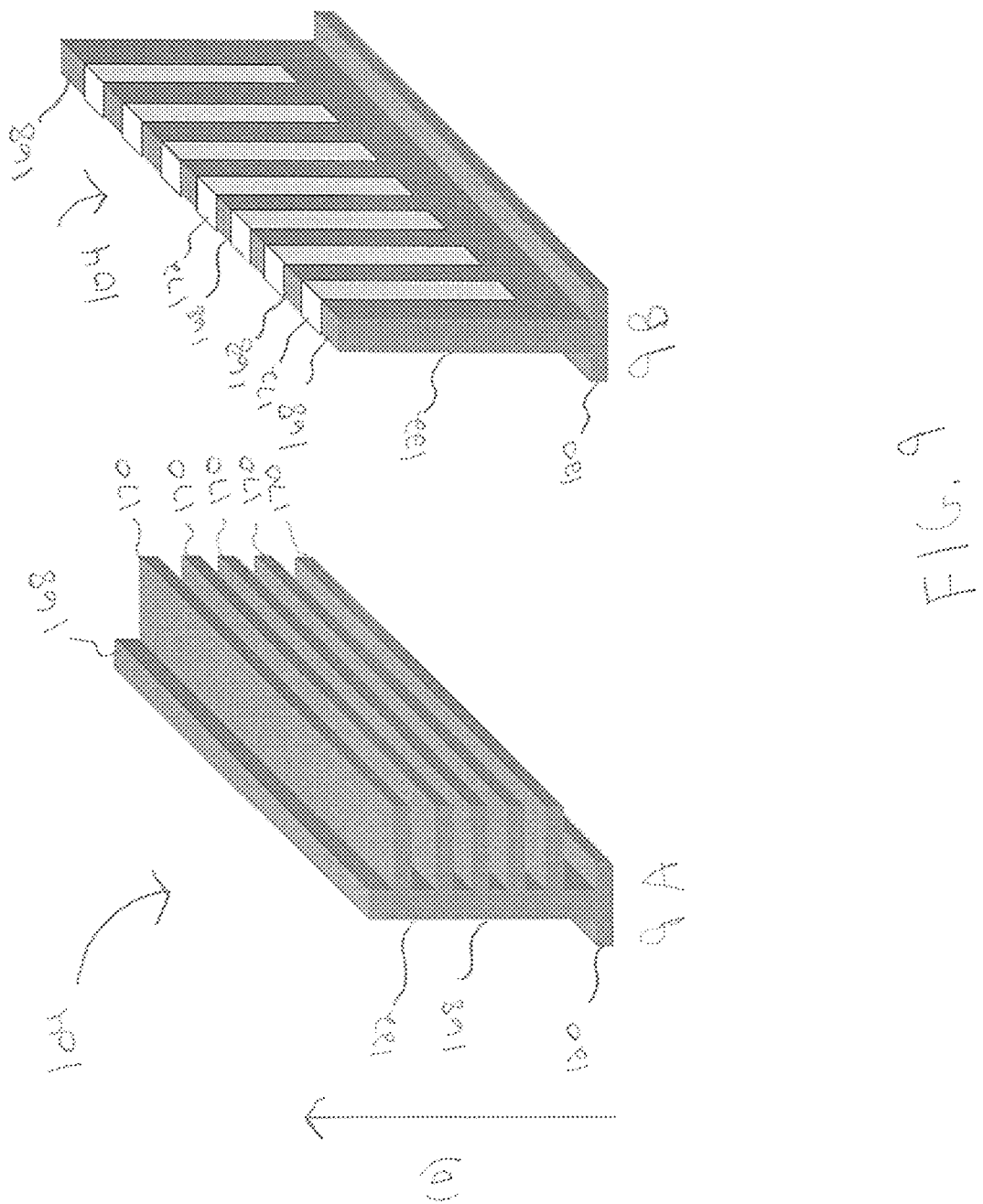

CONNECTABLE PACKAGE EXTENDER FOR SEMICONDUCTOR DEVICE PACKAGE

TECHNICAL FIELD

The present invention generally relates to semiconductor device packaging and more particularly relates to extension portion configurations that dissipate heat away from the device packaging.

BACKGROUND

Semiconductor device packaging is commonly provided for integrated circuits, such as semiconductor chips. A semiconductor device package electrically insulates the semiconductor chip and protects the semiconductor chip from environmental conditions, such as moisture, particles, etc. Additionally, a semiconductor device package is configured to allow the semiconductor chip to be easily electrically connected to external circuitry, such as a printed circuit board. Semiconductor packages are configured in a variety of different ways that are tailored to different applications and different semiconductor chips.

One important design consideration associated with semiconductor device packaging is heat dissipation. In many technology areas, the power consumption per unit area of integrated circuits continues to increase. Heat dissipation may be particularly important in high power applications utilizing power devices, such as power transistors, power integrated circuits, IGBTs and diodes, for example. The high voltages and/or high frequencies that power devices commonly operate at cause the power transistor to generate a substantial amount of heat. The heat generated by semiconductor chips may cause device failure, or may result in degraded electrical connections, which consequently reduces performance.

Heat sinks are included in semiconductor device packages to dissipate heat away from the integrated circuit in a manner that avoids failure or degraded performance. However, known heat sink designs typically require substantial additional area and/or add substantial additional expense to the design of the semiconductor device package.

SUMMARY

According to one embodiment, a semiconductor packaging system is disclosed. The semiconductor packaging system includes a semiconductor device package. The semiconductor device package includes a semiconductor chip having two or more terminals and a protective structure encapsulating and electrically insulating the semiconductor chip. The semiconductor device package further includes two or more electrical conductors extending to an outer surface of the protective structure. Each one of the electrical conductors is electrically connected to one of the terminals. A first surface feature is arranged on an exterior surface of the semiconductor device package. The semiconductor device package further includes a connectable package extender. The connectable package extender includes a second surface feature configured to interlock with the first surface feature when the first surface feature is mated with the second surface feature so as to secure the package extender to the semiconductor device package. The connectable package extender further includes an extension portion adjoining the second surface feature and extending away from the exterior surface of the semiconductor device package when the package extender is secured to the semiconductor device package.

According to another embodiment, a semiconductor device package is disclosed. The semiconductor device package includes a semiconductor chip having two or more terminals and a protective structure encapsulating and electrically insulating the semiconductor chip. The semiconductor device package further includes two or more electrical conductors. Each one of the electrical conductors is electrically connected to one of the terminals and a surface feature on an exterior surface of the package. The surface feature is configured to interlock with a surface feature of a connectable package extender so as to secure the package extender to the semiconductor device package.

According to another embodiment, a method of packaging a semiconductor chip having two or more terminals is disclosed. The method includes providing a semiconductor device package including forming a protective structure encapsulating and electrically insulating the semiconductor chip, forming two or more electrical conductors extending to an outer surface of the protective structure, electrically connecting each of one of the electrical conductors to one of the terminals, and forming a first surface feature on an exterior surface of the semiconductor device package. The method further includes providing a connectable package extender including forming a second surface feature configured to interlock with the first surface feature when the first surface feature is mated with the second surface feature so as to secure the package extender to the semiconductor device package, and forming an extension portion adjoining the second surface feature and extending away from the exterior surface of the semiconductor device package when the package extender is secured to the semiconductor device package.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2 depicts a magnified view of a connective interface between a first surface feature of a semiconductor device package and a second surface feature of a connectable package extender, according to an embodiment.

FIG. 3 including FIGS. 3A and 3B depicts a magnified view of a connective interface between a first surface feature of a semiconductor device package and a second surface feature of a connectable package extender, according to another embodiment.

FIG. 4 including FIGS. 4A and 4B depicts a magnified view of a connective interface between a first surface feature of a semiconductor device package and a second surface feature of a connectable package extender, according to another embodiment.

FIG. 5 including FIGS. 5A, 5B and 5C depicts a semiconductor device package that may be utilized in a semiconductor packaging system having a connectable package extender, according to an embodiment.

FIG. 6 including FIGS. 6A, 6B and 6C depicts a connectable package extender configured to be secured to the semiconductor device package of FIG. 5, according to three different embodiments.

FIG. 7 including FIGS. 7A-7F depicts top-down and side-view perspectives of the connectable package extenders of FIG. 6 secured to the semiconductor device package of FIG. 5.

FIG. 8 including FIGS. 8A and 8B depicts a semiconductor packaging system having a semiconductor device package and a connectable package extender, according to another embodiment.

FIG. 9 including FIGS. 9A and 9B depicts a connectable package extender configured to be secured to the semiconductor device package of FIG. 8, according to two different embodiments.

DETAILED DESCRIPTION

Figure 1:
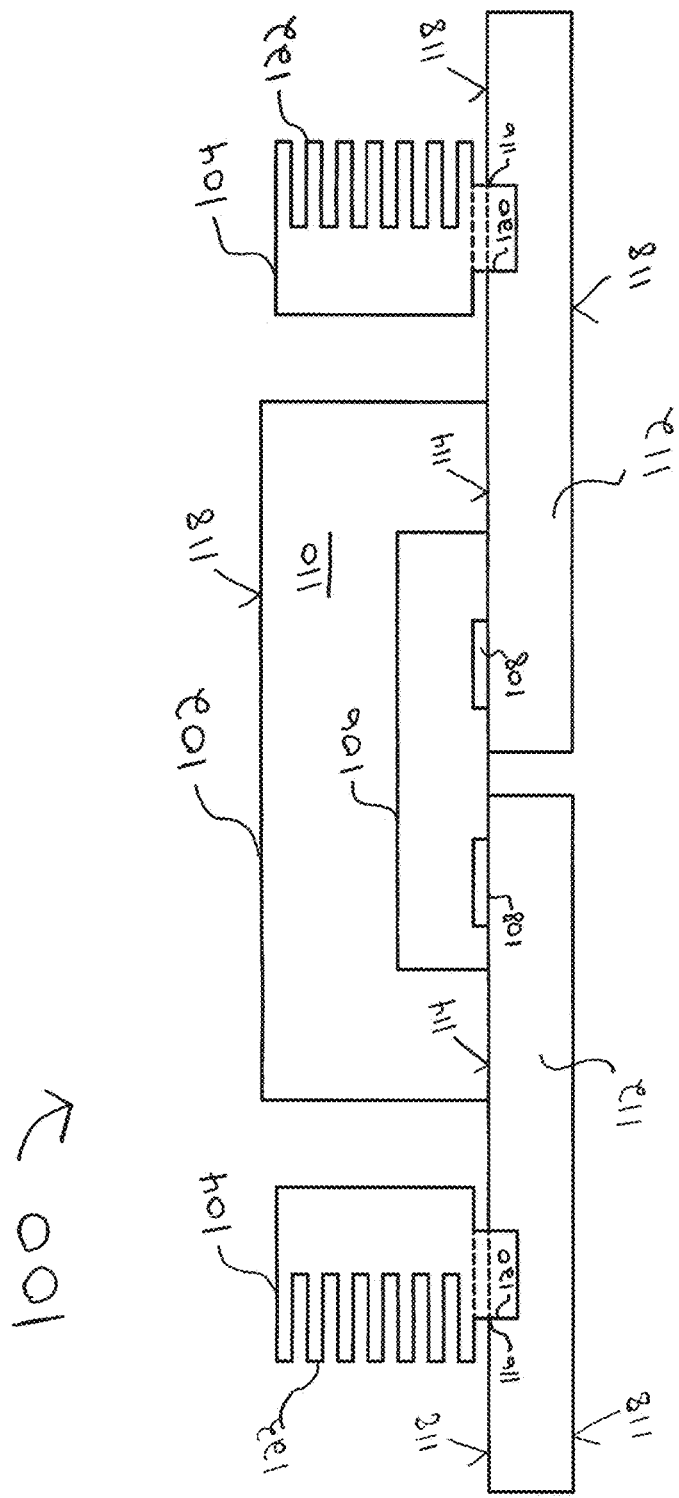
FIG. 1 depicts a side-view of a semiconductor packaging system including a semiconductor device package and a connectable package extender secured to the semiconductor device package, according to an embodiment.

Embodiments described herein provide a semiconductor packaging system having a semiconductor device package and a connectable package extender that may be secured to the semiconductor device package via interlocking surface features. The surface feature of the semiconductor device package is dimensioned complementarily to the surface feature of the connectable package extender so as to enable mating between the two. The surface feature of the semiconductor device package may be a protrusion and the surface feature of the connectable package extender may be a recess. Alternatively, the surface feature of the semiconductor device package may be a recess and the surface feature of the connectable package extender may be a protrusion. The connectable package extender includes an extension portion adjoining the second surface feature and extending away from the exterior surface of the semiconductor device package when the package extender is secured to the semiconductor device package. The package extender may be configured to dissipate heat away from the semiconductor device package when the package extender is secured to the semiconductor device package. For example, the package extender may be formed from a thermally conductive material. Alternatively, the package extender may be formed from a thermally insulating material to reduce electromagnetic interference (EMI).

Advantageously, the embodiments described provide heat dissipation or EMI reduction for a semiconductor device package at minimal expense and area consumption. Because the connectable package extender is a discrete component from the semiconductor device package, the package extender may be customized according to the requirements of a given application. Consequently, a generalized package design may be produced for a variety of applications at minimized expense. The different heat dissipating or EMI requirements of these applications may be met by tailoring the dimensions and configuration of the package extender accordingly. That is, the semiconductor package design considerations are decoupled from the connectable package extender design considerations. This system may be utilized in a variety of package designs, such as surface-mount and transistor-outline packages, to name a few.

FIG. 1 depicts a side-view of an exemplary semiconductor packaging system 100 including a semiconductor device package 102 and a connectable package extender 104. FIG. 1 is a conceptual depiction of a lead-frame package design. However, the system 100 may be implemented in a variety of package designs, and some specific examples will be illustrated in further detail below. The semiconductor device package 102 includes a semiconductor chip 106. The semiconductor chip 106 may be any integrated circuit, such as a microprocessor, an amplifier, a sensor, a diode, a transistor, etc. The semiconductor chip 106 has two or more electrically conductive terminals 108. The electrically conductive terminals 108 may be bonding pads on a top or bottom surface of the semiconductor chip 106, for example.

The semiconductor device package 102 further includes a protective structure 110 encapsulating and electrically insulating the semiconductor chip 106. The protective structure 110 may be made from any commonly known encapsulant material, such as a molded epoxy, plastic or ceramic. The protective structure 110 may be a solid structure that completely surrounds the semiconductor chip 106 or alternatively may be configured to contain the semiconductor chip 106 inside a cavity, with a lid placed over the cavity.

The semiconductor device package 102 further includes two or more electrical conductors 112 extending to an outer surface 114 of the protective structure 110. The electrical conductors 112 provide an electrical connection between the semiconductor chip 106 and an external device, such as a printed circuit board. For instance, the electrical conductors 112 may be external leads extending away from the protective structure 110 that are configured to be inserted in a through-hole. Alternatively, the package may be a leadless package wherein the electrical conductors 112 are metal pads that do not extend beyond the outer surface of the protective structure.

A first surface feature 116 is arranged on an exterior surface 118 of the semiconductor device package 102. The exterior surface 118 may be any out surface of the semiconductor device package 102, such as a surface of the electrical conductors 112 or a surface of the protective structure 110. The first surface feature 116 extends away from the exterior surface 118. For example, the first surface feature 116 may be a protrusion or a recess in the exterior surface 118. The first surface feature 116 forms part of a connective interface that enables the semiconductor device package 102 to be secured to the connectable package extender 104. The connectable package extender 104 includes a second surface feature 120 configured to interlock with the first surface feature 116 when the first surface feature 116 is mated with the second surface feature 120. This interlocking action secures the package extender 104 to the semiconductor device package 102. The second surface feature 120 extends away from a surface of the connectable package extender 104. For example, the second surface feature 120 may be a protrusion or a recess in the connectable package extender 104.

The first surface feature 116 is dimensioned complementarily to the second surface feature 120 so as to enable mating between the two surface features 116, 120. For instance, in the event that the first surface feature 116 is recess in the exterior surface 118, the second surface feature 120 is a protrusion extending away from the connectable package extender 104 that is dimensioned to be inserted in the recess. Alternatively, if the first surface feature 116 is a protrusion, the second surface feature 120 is a recess in the connectable package extender 104 that is dimensioned to receive the protrusion.

The dimensions of the first surface feature 116 correspond to the dimensions of the second surface feature 120. For example, in the event that the first surface feature 116 is a recess, the width of the recess is identical or close to the width of the protrusion of the second surface feature 120 to generate sufficient interlocking action to secure the connectable package extender 104 to the semiconductor device package 102. Certain applications may exert significant forces on the semiconductor packaging system 100 during operation. The dimensions of the first and second surface features 116, 120 can be selected such that the package extender 104 remains secured to the semiconductor device package 102 during normal operation. That is, the first and second surface features 116, 120 can be dimensioned to create sufficient interlocking force to withstand the forces associated with varying applications. Furthermore, a thermal paste may be applied between the first and second surface features 116, 120 to provide a better thermal transfer between the two.

The connectable package extender 104 includes an extension portion 122 adjoining and extending away from the second surface feature 120. When the connectable package extender 104 is secured to the semiconductor device package 102, the extension portion 122 extends away from exterior surface 118 of the semiconductor device package 102 upon which the first surface feature 116 is arranged. The extension portion 122 may be configured to dissipate heat away from the semiconductor device package 102 when the package extender 104 is secured to the semiconductor device package 102. That is, the extension portion 122 may be configured to provide a thermally conductive path that alleviates concentrated heat in the semiconductor device package 102 generated from operation of the semiconductor chip 106. For example, the extension portion 122 may be made of a thermally conductive material and include planar fins that disperse conducted heat to the ambient atmosphere. Further, the extension portion 122 may include an interior channel configured to dissipate heat away from the semiconductor device package 102 via fluid (e.g. gas or liquid) when the package extender 104 is secured to the semiconductor device package 102. Alternatively, the extension portion 122 may be formed from a thermally insulating material to reduce electromagnetic interference with the semiconductor chip 106.

FIGS. 2-4 depict exemplary embodiments of the first surface feature 116 of the semiconductor device package 102 and the correspondingly shaped second surface feature 120 of the connectable extension portion. Referring to FIG. 2, the first surface feature 116 is a groove in the exterior surface 118 and the second surface feature 120 is a protrusion dimensioned to be inserted into the groove. The groove may be on any exterior surface 118 of the semiconductor device package 102, such as the outer surface 114 of the protective structure 110 or a surface of a metal structure, such a lead or a heat sink that extends away from the protective structure 110.

The groove in FIG. 2 is configured as a u-shaped slot. The u-shaped slot has opposing sidewalls 124 extending away from the exterior surface 118 and a bottom surface 126 extending between the opposing sidewalls. According to an embodiment, the opposing sidewalls 124 are parallel to one another and extend away from the exterior surface 118 at a perpendicular angle. The bottom surface 126 may extend between the opposing sidewalls 124 along a plane parallel to the exterior surface 118. Alternatively, the opposing sidewalls 124 may be non-perpendicular with respect to the exterior surface 118 and may be non-perpendicular with respect to the bottom surface 126. The second surface feature 120 is dimensioned in a corresponding fashion as the u-shaped slot. That is, the second surface feature 120 includes a protrusion having sidewalls 128 that are spaced apart by a distance identical to or close to the distance that separates the opposing sidewalls 124 of the u-shaped slot. Thus, the package extender 104 may be securely held in place when the second surface feature 120 is inserted in the u-shaped slot via friction acting between the first and second surface features 116, 120. The package extender 104 may be detached from the semiconductor device package 102 with sufficient force, but should not move substantially under the normal forces associated with the operation of the semiconductor chip 106.

Referring to FIG. 3, the groove is configured as a t-shaped slot. FIG. 3A depicts a side-view of the t-shaped slot and the correspondingly dimensioned second surface feature 120. FIG. 3B depicts a diagonal view of the t-shaped slot. The t-shaped slot has a narrow portion 130 and a widened portion 132. The narrow portion 130 adjoins the exterior surface 118 and includes first opposing sidewalls 134. The widened portion 132 is spaced apart from the exterior surface 118 and adjoins the narrow portion 130. The widened portion 132 includes second opposing sidewalls 136 spaced further apart than the first opposing sidewalls 134. A top surface 138 of the widened portion 132 extends between the first and second opposing sidewalls 134, 136. A bottom surface 140 of the widened portion 132 extends between the second opposing sidewalls 136. According to an embodiment, the first and second sidewalls 134, 136 extend along planes perpendicular to the exterior surface 118 and the top and bottom surfaces 138, 140 extend along planes perpendicular to the exterior surface 118. The t-shape of the t-shaped slot is inverted with respect to the exterior surface 118.

Advantageously, the configuration of the t-shaped slot provides substantial resistance to external forces applied to the connectable package extender 104 in a direction perpendicular to the exterior surface 118. That is, the arrangement of the of the widened portion 132 and the top surface 138 provides an opposing plane that resists movement of the package extender 104 in a direction perpendicular to the exterior surface 118 when the package extender 104 is inserted in the t-shaped slot. In contrast, the u-shaped slot does not provide opposing planes in a similar fashion and relies on friction between the first surface feature 116 and the second surface feature 120 to resist movement of the connectable package extender 104 in a direction perpendicular to the exterior surface 118. The t-shaped slot of FIG. 3 extends to a side 142 of the semiconductor device package 102. The side 142 extends in a different plane than the exterior surface 118. For example, the side 142 may be perpendicular to the exterior surface 118. Thus, the connectable package extender 104 may be secured to the semiconductor device package 102 by laterally sliding the second surface feature 120 in the t-shaped slot in a direction parallel to the exterior surface 118.

Referring to FIG. 4, the first surface feature 116 is configured as a circular protrusion extending away from the exterior surface 118. The circular protrusion is seen from a side-view in FIG. 4A and is seen from a top-down-view in FIG. 4B. The second surface feature 120 is a circular indentation in the package extender 104 dimensioned to receive the circular protrusion. That is, the connectable package extender 104 includes a circular recess having a diameter corresponding to the diameter of the circular protrusion. Thus, the package extender 104 may be secured to the semiconductor device package 102 by fitting the indentation around the protrusion. The diameter of the circular indentation can be the same or approximately close to the diameter of the circular protrusion so that there is adequate friction between the indentation and the protrusion to create an interlocking action and secure the connectable package extender 104 in the manner described above.

FIG. 5 depicts an exemplary semiconductor device package 101 that may be configured to interlock with a connectable heat extender 104. FIG. 5A is a front-view, FIG. 5B is a side-view and FIG. 5C is a top-down-view. The semiconductor device package 101 includes a metal tab 144 extending away from the protective structure 110. According to an embodiment, the metal tab 144 extends away from a top surface 146 of the protective structure 110. The semiconductor device package 101 includes leads 148 extending away from a bottom surface 150 of the protective structure 110 in an opposite direction as the metal tab 144. A semiconductor chip 106 is encapsulated by the protective structure 110 and has terminals that are electrically connected to the leads 148. For instance, the semiconductor chip 106 may be a power transistor having gate, source and drain terminals that are electrically connected to the leads 148. The semiconductor device package 101 may be configured according to any commonly known transistor outline (TO) package design. According to an embodiment, the semiconductor device package 101 is a TO-220 package configuration.

The first surface feature 116 may be formed on the metal tab 144. The first surface feature 116 may be configured according to any of the exemplary embodiments depicted in FIGS. 2-4, for example. The first surface feature 116 depicted in FIG. 5 is configured similar to the t-shaped groove depicted in FIG. 3 in that the first surface feature 116 includes an interior portion with opposing sidewalls configured to interlock with the package extender 104.

FIG. 6 depicts three examples of package extenders 104 that may be interlocked with the semiconductor device package 101 of FIG. 5. The package extenders 104 are configured such that the extension portion 122 contacts a rear surface 152 (depicted in FIG. 5) of the protective structure 110 when the package extender 104 is secured to the semiconductor device package 101. According to an embodiment, the extension portion 122 contacts the entire rear surface 152 of the protective structure 110 between the top and bottom surfaces 146, 150. As a result, the package extender 104 may be secured to the protective structure 110 in a backpack configuration. The extension portion 122 may be configured as a heat sink so as to draw heat away from the rear surface 152. Advantageously, this allows a user to choose whether to include the package extender 104 with the package 101, and, if so, the user may select from a variety differently sized extension portions 122. As a result, the system 100 provides optimal customization based on area and heat dissipation requirements in comparison to semiconductor packages in which the heat sink is a constituent member of the package.

The package extender 104 of FIG. 6A is formed from a thermally conductive material, such as copper, aluminum or a suitable composite. The package extender 104 of FIG. 6A includes planar fins 154 on the extension portion 122 that extend away from the rear surface 152 of the protective structure 110 when the package extender 104 is secured to the semiconductor device package 101. The planar fins 154 of the package extender of FIG. 6A exchange conducted heat with the ambient atmosphere across an expansive surface area.

The package extender 104 of FIG. 6B is formed from a thermally conductive material and includes an interior channel 156 contacting the rear surface of the protective structure 110. The interior channel 156 is configured to dissipate heat away from the semiconductor device package 102 via fluid (e.g. liquid or gas). That is, the package extender 104 of FIG. 6B utilizes a convection effect to exchange heat between the protective structure 110 and the ambient atmosphere. The package extender 104 of FIGS. 6A and 6B may be preferable if, for example, maximum heat dissipation is required.

The package extender 104 of FIG. 6C is formed from a thermally insulating material, such as plastic or ceramic. The package extender 104 of FIG. 6C may be preferable, if, for example, maximum electrical insulation of the semiconductor chip 106 and corresponding electrical connections is required.

FIG. 7 including FIGS. 7A-7F depicts the package extenders 104 of FIG. 6 secured to the semiconductor device package 101 of FIG. 5 via the first and second surface features 116, 120.

FIG. 8A depicts an alternate embodiment of a semiconductor device package 102 that may be used in the presently disclosed system 100. FIG. 8B depicts the semiconductor device package 102 of FIG. 8A with the package extender 104 secured to the package 102 via the first and second surface features 116, 120. The semiconductor device package 102 includes a protective structure 110 having top and bottom surfaces 158, 160. The protective structure 110 may be formed from a molded epoxy, for example. The semiconductor device package 102 may have electrically conductive leads 161, 162 arranged on the bottom surface 160 of the protective structure 110 that extend away from the protective structure 110 in a direction parallel to the bottom surface 160. A semiconductor chip 106 is encapsulated by the protective structure 110. The semiconductor chip 106 has source and drain terminals 164, 166 arranged on top and bottom sides of the semiconductor chip 106 so as to be spaced apart from one another across a vertical direction of the chip. That is, the semiconductor chip 106 may be configured as a vertical device. The source and drain terminals 164, 166 of the semiconductor chip 106 may be electrically connected to first and second leads 161, 162 extending away from one another in a direction parallel to the bottom surface 160 of the protective structure 110. The semiconductor device package 102 may be configured according to a commonly known surface mount package designs, for example. According to an embodiment, the semiconductor device package 102 is configured as an eight pin small shrink outline package (SS08).

In the embodiment of FIG. 8, the first surface feature 116 is arranged on one of the leads and the connectable package extender 104 is secured to the semiconductor device package 102 via the first surface feature 116 in the manner described above. The first surface feature 116 may be configured according to any of the embodiments of FIGS. 2-4, for example. As shown, the first surface feature 116 is arranged on the leads 161, 162 so as to space the package extender 104 apart from the protective structure 110 when the package extender 104 is secured to the semiconductor device package 102. That is, the package extender 104 does not contact the protective structure 110.

More than one of the leads 161, 162 may include one of the first surface features 116 so that more than one heat extender 104 may be secured to the device package 102. If, for example, the semiconductor device package 102 is configured such that the source and drain terminals 164, 166 of a power transistor are electrically connected to the first and second leads 161, 162, a first surface feature 116 may be provided on each of the first and second leads 161, 162. In this power transistor configuration, a large amount of heat may be generated by the power transistor during operation and may particularly be generated at the source and drain terminals 164, 166. Advantageously, the arrangement of the connectable package extender 104 on each of the first and second leads 161, 162 provides a mechanism to conduct heat away from the source and drain terminals 164, 166. This configuration reduces the heat transfer between the first and second leads 161, 162 and the device to which the package 102 is connected to (e.g. a printed circuit board). Heat that is dissipated by the connectable extension portion 122 does not transfer between the leads 161, 162 and the printed circuit board. As a result, the reliability and performance of the electrical connections between the printed circuit board and the leads 161, 162 is improved and the thermal mechanical stress between the printed circuit board and the leads is reduced.

FIG. 9 depicts exemplary embodiments of a connectable package extender 104 that may interlock with the semiconductor device package 102 of FIG. 8 via the first and second surface features 116, 120. The connectable heat extender 104 of FIG. 9 may be made from a thermally conductive material, such as copper or aluminum. In the embodiment of FIG. 9A, the extension portion 122 includes an elongated member 168 adjoining and extending away from the second surface feature 120 in a first direction (D). The first direction (D) may be perpendicular to a base of the package extender 104 so as to form a t-shape that may be inserted in the t-shaped groove previously discussed. Thus, when the connectable package extender 104 is secured to the semiconductor device package 102, the elongated member 168 extends along a plane perpendicular to the exterior surface 118 from which the first surface feature 116 is arranged. The extension portion 122 further includes planar fins 170 adjoining and extending away from the elongated member 168 in a direction substantially perpendicular to the first direction (D). The planar fins 170 provide an expansive surface that transmits heat conducted by the package extender 104 to the ambient atmosphere.

In the embodiment of FIG. 9B, the extension portion 122 includes a plurality of elongated members 168 extending away from the second surface feature 120 in the first direction (D). All of the elongated members 168 in the plurality are spaced apart from one other by voids 172 extending in the first direction (D). The configuration of the voids 172 between the elongated members 168 provides an expansive surface area for transmission of heat conducted by the package extender 104 to the ambient atmosphere. Further, the configuration of FIG. 9B requires less area than other extension portion designs, such as the planar fin configuration of FIG. 9A. The dimensions of the heat extenders 104 depicted in FIG. 9 may be adjusted according to application requirements. For instance, the elongated members 168 may be lengthened or shortened, the number of planar fins 170 may be increased or decreased, and the length of the planar fins 170 in a direction perpendicular to the first direction (D) may be adjusted, depending on the space available and amount of heat dissipation required.

The embodiments of FIGS. 1-9 may be utilized in a method of packaging a semiconductor chip 106. According to the method, a semiconductor device package 102 is provided. The semiconductor device package 102 may be provided by forming a protective structure 110 encapsulating and electrically insulating the semiconductor chip 106. The protective structure 110 may be formed by injecting thermoplastic or thermoset polymer into a mold cavity, for example. Two or more electrical conductors 112 that extend to an outer surface of the protective structure 110 are formed. The electrical conductors 112 may be formed from copper or aluminum, for example. Each one of the electrical conductors 112 is electrically connected to one of the terminals 108 using commonly known techniques, such as wire bonding and/or soldering.

A first surface feature 116 is formed on an exterior surface 118 of the semiconductor device package 102. The first surface feature 116 may be any of the first surface features 116 in the embodiments of FIGS. 2-4, for example. That is, the first surface feature 116 may be a u-shaped groove, a t-shaped groove, or may be a protrusion extending from an exterior surface 118 of the semiconductor device package 102. The first surface feature 116 may be formed by etching, stamping, or any other commonly known manufacturing technique. In the case that the protective structure 110 is formed by injection molding and the first surface feature 116 is arranged on the protective structure 110, the first surface feature 116 may be formed by configuring the mold cavity in a corresponding manner.

The method further includes providing a connectable package extender 104. The connectable package extender 104 may be any of the package extenders 104 previously discussed. A second surface feature 120 configured to interlock with the first surface feature 116 when the first surface feature 116 is mated with the second surface feature 120 so as to secure the package extender 104 to the semiconductor device package 102 is formed. The second surface feature 120 may be formed by etching, stamping, or any other commonly known manufacturing technique.

Providing the connectable package extender 104 further includes forming an extension portion 122 adjoining the second surface feature 120 and extending away from the exterior surface 118 of the semiconductor device package 102 when the package extender 104 is secured to the semiconductor device package 102. The extension portion may 122 be any of the configurations discussed herein.

According to an embodiment, the method includes securing the package extender 104 to the semiconductor device package 102 by aligning the second surface feature 120 with the first surface feature 116. For instance, in the event that the first surface feature 116 is a groove, the package extender 104 may be secured to the semiconductor device package 102 by inserting the second surface feature 120 into the groove as described above with reference to FIGS. 3 and 4.

According to an embodiment the method includes forming the connectable package extender 104 from a thermally conductive material. In this manner, the connectable package extender 104 may be used as a heat sink to dissipate heat away from the semiconductor device package 102 when the connectable package extender 104 is secured to the semiconductor device package 102.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor packaging system, comprising:
   a semiconductor device package, comprising:
      a semiconductor chip comprising two or more terminals;
      a protective structure encapsulating and electrically insulating the semiconductor chip;
      an electrically conductive lead extending away from the protective structure in a first direction, the electrically conductive lead being electrically connected to one of the terminals; and
      a first surface feature formed on an exterior surface of the electrically conductive lead; and
   a connectable package extender, comprising:
      a second surface feature configured to interlock with the first surface feature when the first surface feature is mated with the second surface feature so as to secure the package extender to the semiconductor device package;
      an extension portion adjoining the second surface feature and extending away from the electrically conductive lead in a second direction that is substantially perpendicular to the first direction when the package extender is secured to the semiconductor device package.

2. The packaging system of claim 1, wherein the extension portion is configured to dissipate heat away from the semiconductor device package when the package extender is secured to the semiconductor device package.

3. The semiconductor packaging system of claim 1, wherein the first surface feature is a groove in the exterior surface of the electrically conductive lead and wherein the second surface feature of the connectable package extender is a protrusion dimensioned to be inserted in to the groove.

4. The packaging system of claim 3, wherein the groove is a u-shaped slot comprising opposing sidewalls and a bottom surface extending between the opposing sidewalls.

5. The packaging system of claim 3, wherein the groove is a t-shaped slot comprising:
   a narrow portion adjoining the exterior surface comprising first opposing sidewalls extending perpendicular to the exterior surface; and
   a widened portion spaced apart from the exterior surface and adjoining the narrow portion, the widened portion comprising second opposing sidewalls extending perpendicular to the exterior surface and spaced further apart than the first opposing sidewalls, a top surface extending between the first and second opposing sidewalls parallel to the exterior surface, and a bottom surface extending between the second opposing sidewalls parallel to the exterior surface.

6. The semiconductor packaging system of claim 1, wherein the first surface feature is a circular protrusion extending away from the exterior surface and wherein the second surface feature is a circular indentation dimensioned to receive the circular protrusion.

7. The semiconductor device packaging system of claim 1, wherein the semiconductor chip is a power transistor comprising source and drain terminals on top and bottom sides of the semiconductor chip, wherein the semiconductor device package comprises first and second leads extending away from one another in opposite directions, wherein the source and drain terminals are electrically connected to the first and second leads, and wherein each of the first and second leads comprise the first surface feature.

8. The packaging system of claim 1, wherein the connectable package extender comprises an elongated member adjoining and extending away from the second surface feature of the connectable package extender in the second direction and planar fins adjoining and extending away from the elongated member in the first direction when the package extender is secured to the semiconductor device package.

9. The packaging system of claim 1, wherein the connectable package extender comprises a plurality of elongated members extending away from the second surface feature of the connectable package extender in the second direction when the package extender is secured to the semiconductor device package, the plurality of elongated members spaced apart from one other by voids extending in the second direction.

10. The packaging system of claim 1, wherein the connectable package extender is a continuous structure that includes the second surface feature and the extension portion as integrally formed components.

11. The packaging system of claim 1, wherein the first and second surface features are dimensioned to enable a secure connection such that the connectable package extender is held securely in place via friction acting between the first and second surface features.

12. A semiconductor device package, comprising:
   a semiconductor chip comprising two or more terminals;
   a protective structure encapsulating and electrically insulating the semiconductor chip;
   an electrically conductive lead extending away from the protective structure in a first direction, the electrically conductive lead being electrically connected to one of the terminals; and
   a surface feature on an exterior surface of the electrically conductive lead,
   wherein the surface feature is configured to interlock with a surface feature of a connectable package extender so as to secure the package extender to the semiconductor device package such that the package extender extends away from the electrically conductive lead in a second direction that is direction substantially perpendicular to the first direction.

13. The semiconductor device package of claim 12, wherein the semiconductor chip is a power transistor comprising source and drain terminals on top and bottom sides of the semiconductor chip, wherein the semiconductor package comprises first and second leads extending away from one another in a direction parallel to the top and bottom sides, wherein the source and drain terminals are electrically connected to the first and second leads, and wherein each of the first and second leads comprise the surface feature.

14. The semiconductor device package of claim 12, wherein the surface feature is a t-shaped slot, the t-shaped slot comprising:
   a narrow portion adjoining the exterior surface comprising first opposing sidewalls extending perpendicular to the exterior surface;

a widened portion beneath the exterior surface and adjoining the narrow portion, the widened portion comprising second opposing sidewalls extending perpendicular to the exterior surface and spaced further apart than the first opposing sidewalls, a top surface extending between the first and second opposing sidewalls parallel to the exterior surface, and a bottom surface extending between the second opposing sidewalls parallel to the exterior surface.

* * * * *